(12) United States Patent
Seo et al.

(10) Patent No.: US 10,971,096 B2
(45) Date of Patent: Apr. 6, 2021

(54) DISPLAY DEVICE

(71) Applicant: LG Display Co., Ltd., Seoul (KR)

(72) Inventors: Daeyoung Seo, Paju-si (KR); Joon Heo, Paju-si (KR); YoungMin Jeong, Paju-si (KR); SeungHwan Shin, Jeonju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/522,266

(22) Filed: Jul. 25, 2019

(65) Prior Publication Data
US 2020/0074947 A1 Mar. 5, 2020

(30) Foreign Application Priority Data
Sep. 3, 2018 (KR) ........................ 10-2018-0104650

(51) Int. Cl.
| | |
|---|---|
| *G06F 1/00* | (2006.01) |
| *G09G 3/36* | (2006.01) |
| *G02F 1/133* | (2006.01) |
| *G02F 1/1368* | (2006.01) |
| *G02F 1/1362* | (2006.01) |
| *G09G 3/3225* | (2016.01) |
| *H01L 27/144* | (2006.01) |
| *G06F 3/042* | (2006.01) |

(52) U.S. Cl.
CPC ......... *G09G 3/3648* (2013.01); *G02F 1/1368* (2013.01); *G02F 1/13318* (2013.01); *G02F 1/13624* (2013.01); *G02F 1/136213* (2013.01); *G02F 1/136227* (2013.01); *G02F 1/136286* (2013.01); *G09G 3/3225* (2013.01); *G09G 3/3607* (2013.01); *H01L 27/1443* (2013.01); *G02F 2201/121* (2013.01); *G02F 2201/123* (2013.01); *G06F 3/042* (2013.01); *G09G 2300/0426* (2013.01); *G09G 2300/0465* (2013.01); *G09G 2360/14* (2013.01)

(58) Field of Classification Search
None
See application file for complete search history.

(56) References Cited

U.S. PATENT DOCUMENTS

| | | | |
|---|---|---|---|
| 2011/0205260 A1* | 8/2011 | Weng | G09G 3/3648 345/691 |
| 2016/0321987 A1 | 11/2016 | Oh | |
| 2017/0200411 A1* | 7/2017 | Song | G09G 3/3233 |

FOREIGN PATENT DOCUMENTS

| | | |
|---|---|---|
| JP | 2003332581 A | 11/2003 |
| JP | 2011018053 A | 1/2011 |

(Continued)

*Primary Examiner* — Michael A Faragalla
(74) *Attorney, Agent, or Firm* — Seed IP Law Group LLP

(57) ABSTRACT

A display device includes a sensing storage line disposed in a first direction; a sensing data line disposed in a second direction; pixel thin film transistors which includes a first gate electrode connected to a gate line, a first source electrode connected to a data line, and a first drain electrode spaced apart from the first source electrode; and sensor thin film transistors which include a second gate electrode connected to the sensing storage line, a second source electrode electrically connected to the sensing data line, and a second drain electrode spaced apart from the second source electrode, wherein the second drain electrode may be electrically connected to the first drain electrode to share a pixel storage capacitor.

15 Claims, 17 Drawing Sheets

(56) References Cited

FOREIGN PATENT DOCUMENTS

| | | |
|---|---|---|
| JP | 2015018243 A | 1/2015 |
| JP | 2015-230607 A | 12/2015 |
| JP | 6330975 B1 | 5/2018 |
| KR | 10-2018-0049290 A | 5/2018 |
| KR | 10-2018-0058281 A | 6/2018 |
| KR | 20190125039 A | 11/2019 |

* cited by examiner

| Case | Vdr VOLTAGE | | | FIRST EXEMPLARY EMBODIMENT | | SECOND EXEMPLARY EMBODIMENT | |
|---|---|---|---|---|---|---|---|
| | R | G | B | Dot Color | IMPLEMENTED COLOR | Dot Color | IMPLEMENTED COLOR |
| 1 | Vcom | Vcom | Vcom | Black | Black | Black | Black |
| 2 | 255G Vdd | Vcom | Vcom | Red+Blue | Magenta | Red | Red |
| 3 | Vcom | 255G Vdd | Vcom | Green+Red | Yellow | Green | Green |
| 4 | Vcom | Vcom | 255G Vdd | Blue+Green | Cyan | Blue | Blue |
| 5 | 255G Vdd | 255G Vdd | 255G Vdd | White | White | White | White |

DISPLAY DEVICE

CROSS-REFERENCE TO RELATED APPLICATION

This application claims the priority of Korean Patent Application No. 10-2018-0104650 filed on Sep. 3, 2018, in the Korean Intellectual Property Office, the disclosure of which is incorporated herein by reference.

BACKGROUND

Technical Field

The present disclosure relates to a display device, and more particularly, to a display device which is capable of performing photo sensing.

Description of the Related Art

As it enters an information era, a display field which visually expresses electrical information signals has been rapidly developed, and in response to this, various display devices having excellent performances such as thin-thickness, light weight, and low power consumption have been developed.

Examples of the display device may include a liquid crystal display device (LCD), an organic light emitting display device (OLED), and the like.

Recently, the display device includes a touch screen which allows a user to easily, intuitively, and conveniently input information and commands departing from a normal input method such as a button, a keyboard, or a mouse.

There is a pointer which indicates a specific portion of a displayed image. In the related art, a laser pointer which emits a laser beam has been frequently used. A user uses the laser pointer to indicate a desired portion by illuminating a desired spot on the display device with a laser beam.

However, since an image of the display device has a luminance which is similar to or higher than the laser beam, a pointing technique having a high visibility is requested.

BRIEF SUMMARY

Recently, a technique which senses a current generated when a laser beam is incident onto a thin film transistor through a lead-out line to implement a laser point part as an image, using a characteristic of an amorphous silicon thin film transistor that when light is received, a leakage current (off current) is increased, has been developed.

However, in this case, a separate circuit such as a lead-out line for processing an output of a photo sensor is necessary. In this case, a ripple of a common voltage due to a transition of a display signal, that is, a data signal is transmitted to the lead-out line to cause a noise. The noise is increased in accordance with the increased size of the panel, so that the increase of the size of the panel is limited.

Therefore, an object to be achieved by the present disclosure is to provide a display device which is capable of performing photo-sensing and self-image expression with no restriction on the size of the panel, without using a separate circuit such as a lead-out line or signal processing.

Objects of the present disclosure are not limited to the above-mentioned objects, and other objects, which are not mentioned above, can be clearly understood by those skilled in the art from the following descriptions.

In order to solve the above-described problems, according to an aspect of the present disclosure, a display device includes: a plurality of gate lines disposed in a first direction; a plurality of data lines which is disposed in a second direction different from the first direction to define a plurality of sub pixels together with the plurality of gate lines; a sensing storage line disposed in the first direction; a sensing data line disposed in the second direction; pixel thin film transistors, each pixel thin film transistor including a first gate electrode connected to a respective one of the plurality of gate lines, a first source electrode connected to a respective one of the plurality of data lines, and a first drain electrode spaced apart from the first source electrode; and sensor thin film transistors, each sensor thin film transistor including a second gate electrode connected to the sensing storage line, a second source electrode electrically connected to the sensing data line, and a second drain electrode spaced apart from the second source electrode, the second drain electrode electrically connected to the first drain electrode to share a pixel storage capacitor.

In order to solve the above-described problems, according to another aspect of the present disclosure, a display device includes: a plurality of gate lines and a plurality of data lines which overlie each other to define a plurality of sub pixels; pixel thin film transistors each disposed in one of the sub pixels; pixel storage capacitors each disposed in one of the sub pixels; and sensor thin film transistors which share the pixel storage capacitors with the pixel thin film transistors and implement a predetermined image in the corresponding sub pixels in response to the incident predetermined light source.

Other detailed matters of the exemplary embodiments are included in the detailed description and the drawings.

According to the present disclosure, the photo-sensing and the self-image expression are possible and a visibility of a laser pointer is improved. Specifically, according to the present disclosure, only a sensor thin film transistor is added without adding a separate circuit or performing signal processing, so that a process and a cost may be saved.

According to the present disclosure, it is not affected by the noise due to the transition of the data signal so that a size and a resolution of the panel may be advantageously increased and a sensor thin film transistor is disposed in every sub-pixel to increase a photo-sensing precision.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
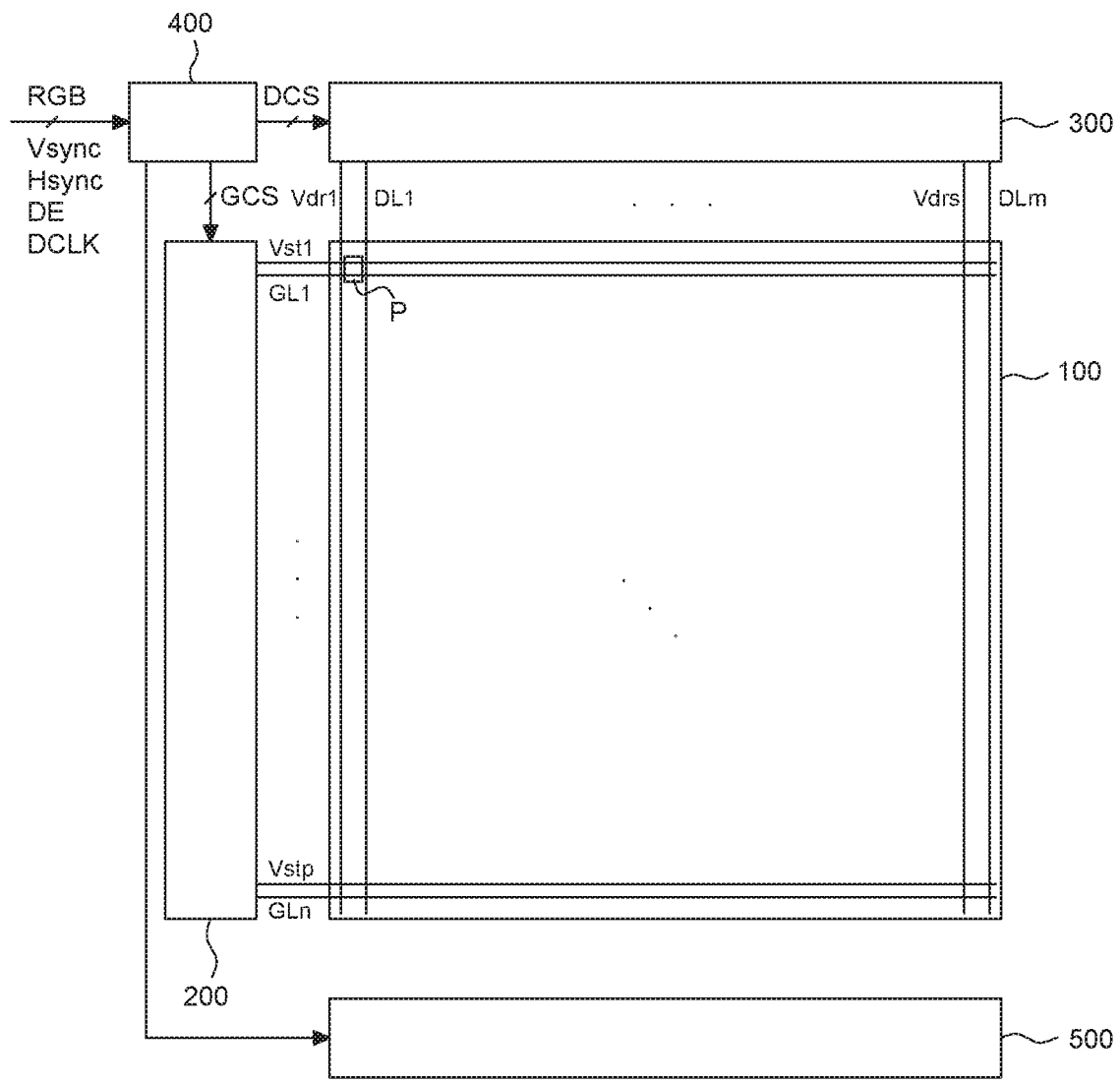
FIG. 1 is a block diagram illustrating a display device according to the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly".

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereafter, various embodiments of the present disclosure will be described in detail with reference to the accompanying drawings.

FIG. 1 is a block diagram illustrating a display device according to the present disclosure.

Referring to FIG. 1, a display device according to an exemplary embodiment of the present disclosure may configured to include mainly a display panel 100, a gate drive circuit 200, a data drive circuit 300, a timing controller 400, and a touch drive circuit 500.

In the display panel 100, gate lines GL1 to GLn and common lines (not illustrated) may be disposed in a first direction and data lines DL1 to DLm are disposed in a second direction which is different from the first direction.

Further, in the display panel 100, sensing data lines Vdr1 to Vdrs may be disposed between the data lines DL1 to DLm in the second direction. Further, sensing storage lines Vst1 to Vstp may be disposed between the gate lines GL1 to GLn in the first direction.

For example, the plurality of gate lines GL1 to GLn and the plurality of data lines DL1 to DLm overlie or intersect each other to define a plurality of sub pixels P.

The plurality of sub pixels P is electrically connected to the gate lines GL1 to GLn, the data lines DL1 to DLm, and the common lines and may display images by a pixel driving signal or a pixel driving voltage applied through the gate lines GL1 to GLn, the data lines DL1 to DLm, and the common lines.

The display panel 100 according to the exemplary embodiment of the present disclosure may be configured to have a double rate driving (DRD) structure in which one pair of sub pixels P adjacent to each other is commonly connected to one data line of the data lines DL1 to DLm. However, the present disclosure is not limited thereto. For reference, according to the DRD structure, the same resolution may be implemented while reducing the number of data integrated circuits which configure a data drive circuit by reducing the number of data lines by half, instead of doubling the number of gate lines, as compared with a normal display panel.

As described above, the display panel 100 according to the present disclosure has the DRD structure so that the sensing data lines Vdr1 to Vdrs may be disposed using a partial area in which the data lines DL1 to DLm of the related art are disposed. Further, a photo touch sensor (not illustrated) is disposed in a partial area to which the gate lines GL1 to GLn are disposed to be adjacent. Therefore, the display panel 100 may include a photo touch sensor for sensing photo touch without reducing an aperture ratio as compared with the general display device.

The display panel 100 includes a plurality of sub pixels P and may display images based on a gray scale level displayed by each sub pixel P. In this case, when a liquid crystal panel is used as an example of the display panel 100, each of the plurality of sub pixels P may include a pixel electrode which is driven by a signal applied through the gate lines GL1 to GLn and the data lines DL1 to DLm and a common electrode which is driven by a common line. In each of the plurality of sub pixels P, liquid crystals are tilted by a voltage difference between the pixel electrode and the common electrode to display images. However, the present disclosure is not limited to the liquid crystal panel.

The plurality of sub pixels P illustrated in FIG. 1 may display different colors and the plurality of sub pixels P may form a unit to configure one pixel. For example, the sub pixel P may display any one of red, green, and blue or display any one of red, green, blue, and white.

A plurality of sensor pixel units may be defined in the display panel 100.

The sensor pixel unit may be formed by a plurality of sub pixels P.

The sensor pixel unit may include a photo touch sensor which recognizes touch in accordance with the change of the off-current of the sensor thin film transistor which varies in accordance with light intensity. More specifically, the photo touch sensor includes a sensor thin film transistor and a sensor storage capacitor. The sensor thin film transistor is turned on in accordance with the light intensity to charge the voltage in the sensor storage capacitor. Further, an external circuit configuration for analyzing or detecting the sensing is not provided so that the image expression may be determined only by a diameter of an external light source. Therefore, in order to improve the visibility and the sensing precision, a sensor thin film transistor may be disposed in every dot sub pixel, but the present disclosure is not limited thereto.

In this case, according to the present disclosure, the pixel thin film transistor and the sensor thin film transistor share the storage capacitor so that the image is output to the sub pixel without separately performing the signal processing to recognize the touch. The sensor thin film transistor is directly connected to the pixel storage capacitor to charge or discharge the voltage of the sub pixel stored in the liquid crystal capacitor and the pixel storage capacitor.

As described above, according to the present disclosure, the photo-sensing and the self-image expression are possible without using a separate circuit such as a lead-out line or performing signal processing and a visibility of a laser pointer is improved. Specifically, only a sensor thin film transistor is added without adding a separate circuit or performing signal process, so that a process and a cost may be saved.

Further, according to the present disclosure, it is not affected by the noise due to the transition of the data signal so that the size and a resolution of the panel may be advantageously increased and a sensor thin film transistor is disposed in every sub-pixel to increase a photo-sensing precision.

The structure of the sensor pixel unit will be described in more detail with reference to the following drawings.

The gate drive circuit 200 may supply sequentially gate signals to the gate lines GL1 to GLn in accordance with a gate driving control signal GCS transmitted from the timing controller 400. The gate drive circuit 200 may include a shift register, a level shifter, and the like.

The gate drive circuit 200 may be independently disposed from the display panel 100 or may be embedded as a thin film type in a non-display area where the sub pixel P of the display panel 100 is not disposed by a gate in panel (GIP) method at the time of manufacturing a substrate of the display panel 100.

The data drive circuit 300 generates a sampling signal by the data driving control signal DCS transmitted from the timing controller 400 and changes the image data input from the timing controller 400 into a data signal DS by latching the image data in accordance with the sampling signal, and then may supply the data signal to the data lines DL1 to DLm in response to a source output enable (SOE) signal.

The data drive circuit 300 is connected to a bonding pad of the display panel 100 by a chip on glass (COG) method or may be directly disposed on the display panel 100. In some cases, the data drive circuit 300 may be disposed to be integrated with the display panel 100. Further, the data drive circuit 300 may be disposed by a chip on film (COF) method.

The timing controller 400 may transmit an input image signal RGB, which is received from a host system (not illustrated), to the data drive circuit 300.

Further, the timing controller 400 may generate a timing control signal for controlling an operation timing of the gate drive circuit 200 and the data drive circuit 300 using timing signals such as a clock signal DCLK, a horizontal synchronization signal Hsync, a vertical synchronization signal Vsync, and a data enable signal DE which are received together with the input image signal RGB. The timing controller 400 is synchronized with the timing signal to generate a control signal GCS of the gate drive circuit 200 and a control signal DCS of the data drive circuit 300.

Further, the timing controller 400 generates a touch driving signal for driving the photo touch sensor to transmit the touch driving signal to the touch drive circuit 500. The timing controller 400 receives the touch sensing signal from the touch drive circuit 500 to calculate touch information.

The touch drive circuit 500 may apply the touch driving signal transmitted from the timing controller 400 to the photo touch sensor.

Figure 2:
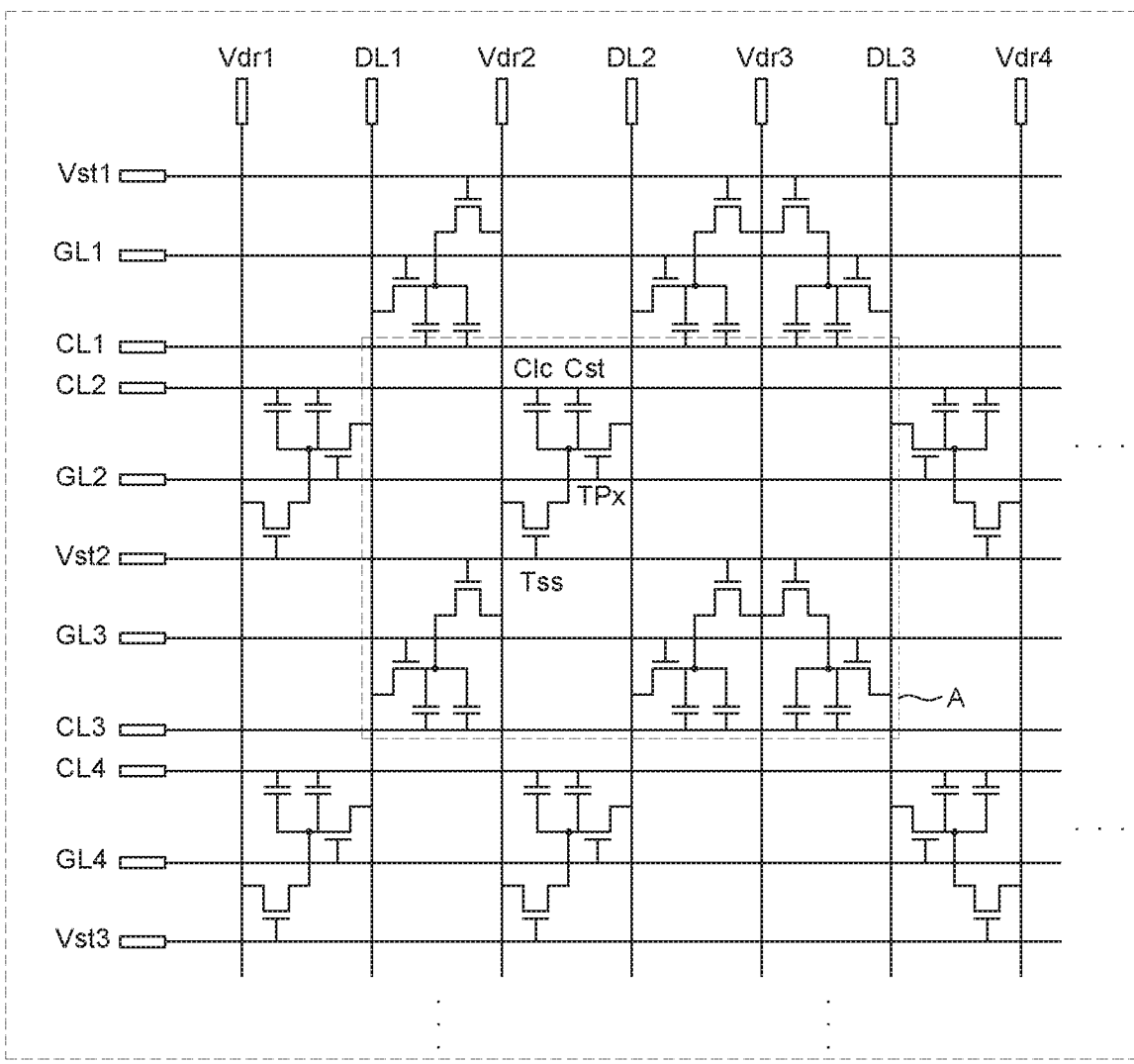
FIG. 2 is an equivalent circuit diagram illustrating a part of a display panel according to a first exemplary embodiment of the present disclosure.

FIG. 2 is an equivalent circuit diagram illustrating a part of a display panel according to a first exemplary embodiment of the present disclosure.

According to the first exemplary embodiment of the present disclosure illustrated in FIG. 2, one sensor thin film transistor is provided in every sub pixel as an example, but the present disclosure is not limited thereto.

Figure 3:
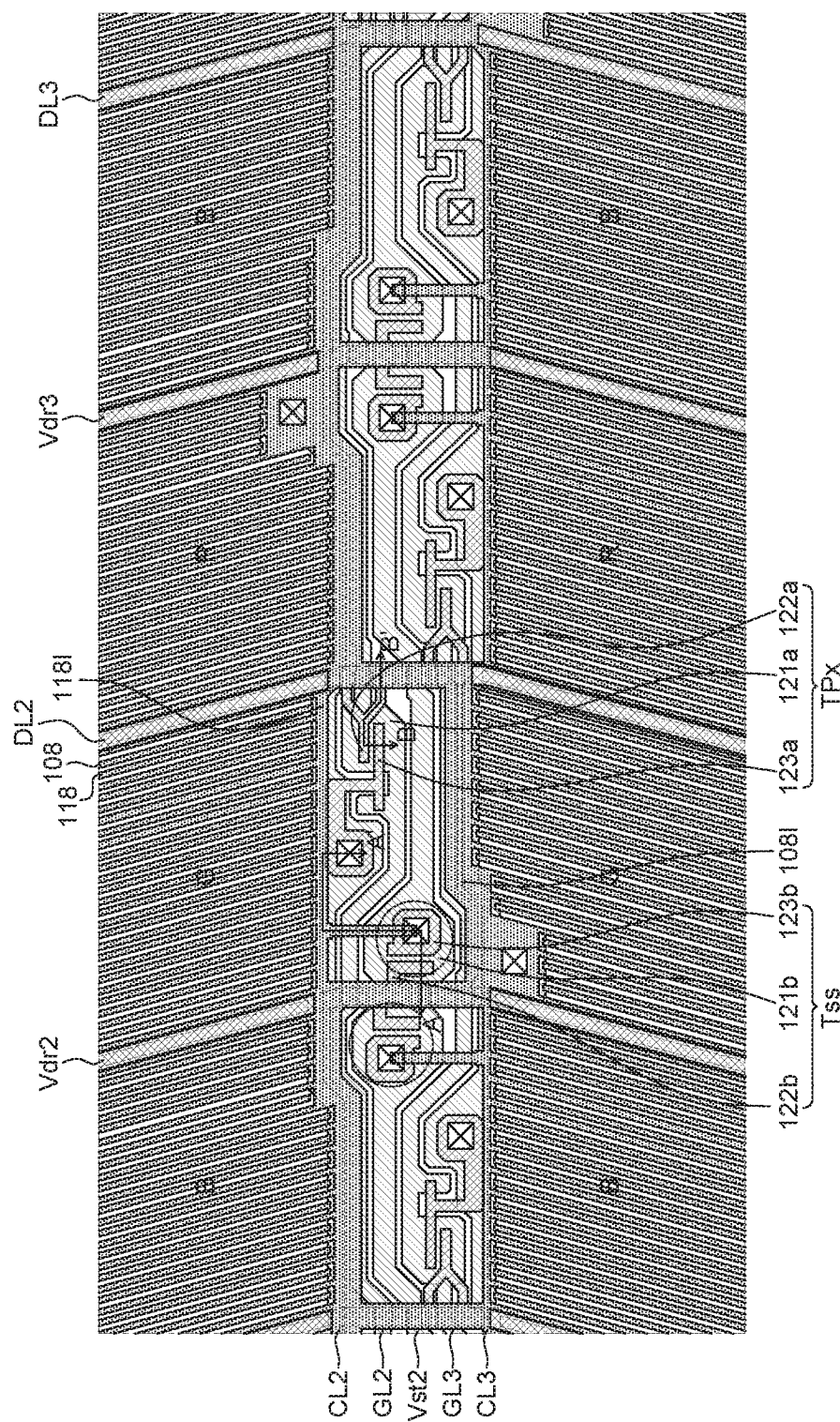
FIG. 3 is a plan view illustrating a part of a display panel according to a first exemplary embodiment of the present disclosure.

FIG. 3 is a plan view illustrating a part of a display panel according to a first exemplary embodiment of the present disclosure. FIG. 3 illustrates a planar structure of a display panel for a part A of FIG. 2. For example, FIG. 3 illustrates some of eight sub pixels. In FIG. 3, for example, a blue sub pixel B, a green sub pixel G, and a red sub pixel R are sequentially and repeatedly disposed as an example, but the present disclosure is not limited thereto.

First, referring to FIG. 2, in the display panel according to the first exemplary embodiment of the present disclosure, a plurality of sub pixels is disposed to display images and one sensor thin film transistor Tss is disposed in every sub pixel to sense incident light and may recognize the touch. In this case, FIG. 2 illustrates that one sensor thin film transistor Tss is provided in every sub pixel, as an example.

Even though not specifically illustrated, a plurality of sub pixels is disposed in the display panel and each of the sub pixels may be any one of red, green, and blue sub pixels.

The plurality of sub pixels may be disposed in a double rate driving (DRD) manner. More specifically, sub pixels which are disposed to be adjacent, among the plurality of sub pixels, for example, a sub pixel in a first column and a sub pixel in a second column are electrically connected to the same data line of data lines DL1, DL2, and DL3, such as a first data line DL1. Further, a sub pixel in a first row and a sub pixel in a second row may be connected to different gate lines GL1, GL2, GL3, and GL4, for example, to the first gate line GL1 and the second gate line GL2.

In this case, since the sub pixels have a DRD structure, when a vertical common line is disposed between the data lines DL1, DL2, and DL3 other than the common line CL1, CL2, CL3, and CL4, a total resistance of the common lines CL1, CL2, CL3, and CL4 may be drastically reduced. However, the present disclosure is not limited thereto.

As descried above, the common lines CL1, CL2, CL3, and CL4, the gate lines GL1, GL2, GL3, and GL4, and the sensing storage lines Vst1, Vst2, Vst3 may be provided in the first direction.

The sensing storage lines Vst1, Vst2, and Vst3 may be disposed to be adjacent to the common line and distribute the voltage to every line in the horizontal direction.

Further, the data lines DL1, DL2, and DL3 and the sensing data lines Vdr1, Vdr2, Vdr3, and Vdr4 may be provided in a second direction which is different from the first direction.

The sensing data lines Vdr1, Vdr2, Vdr3, and Vdr4 are wiring lines which transmit a sensor data signal, that is, a photo touch sensor driving signal to the sensor thin film transistor Tss.

The sensing data lines Vdr1, Vdr2, Vdr3, and Vdr4 may output the sensor data signal to three external wiring lines for every red, green, or blue sub pixel, above the data pad, but the present disclosure is not limited thereto. When the wiring lines are divided, various colors may be implemented in accordance with a sensing data voltage level which is applied to every red, green, or blue sub pixel.

Even though not illustrated in the drawing, a pad which is capable of applying a DC is configured in a link dummy unit and the line may be independently configured to apply a signal to a D-IC dummy PIN.

Referring to FIG. 2, each of the plurality of sub pixels P may include a pixel thin film transistor TPx, a pixel capacitor Clc and a pixel storage capacitor Cst which are connected to the pixel thin film transistor TPx in parallel.

Further, each sub pixel according to the first exemplary embodiment of the present disclosure further includes a sensor thin film transistor Tss connected to the pixel storage capacitor Cst.

Even though not illustrated in the drawing, each sub pixel may be configured by a pixel electrode electrically connected to the pixel thin film transistor TPx, a common electrode which supplies a common voltage, and a liquid crystal layer in which liquid crystals are tilted by a vertical electric field or a horizontal electric field by the pixel electrode and the common electrode.

In this case, the pixel thin film transistor TPx may store a data signal which is applied from the data lines DL1, DL2, and DL3 in response to a gate signal applied from the gate lines GL1, GL2, GL3, and GL4 in the pixel capacitor Clc and the pixel storage capacitor Cst.

As described above, the liquid crystals may be driven in accordance with the data signal stored in the pixel capacitor Clc and the pixel storage capacitor Cst may stably maintain a data signal of the pixel capacitor Clc.

In this case, it has been described that the display panel according to the first exemplary embodiment is a liquid crystal panel as an example, but the present disclosure is not limited thereto. For example, the display panel according to the first exemplary embodiment of the present disclosure may be an organic light emitting display panel. When the display panel is an organic light emitting display panel, the organic light emitting display panel may include an anode connected to the pixel thin film transistor TPx, a light emitting layer formed of an organic material, and a cathode.

As described above, the first exemplary embodiment of the present disclosure includes sensing data lines Vdr1, Vdr2, Vdr3, and Vdr4 and sensing storage lines Vst1, Vst2, and Vst3.

Further, the pixel thin film transistor TPx and the sensor thin film transistor Tss share a storage capacitor, that is, the pixel storage capacitor Cst so that the photo sensing is possible without using a separate circuit such as a lead-out line or performing the signal processing. Further, according to the first exemplary embodiment of the present disclosure, the sensor storage and the pixel storage are shared to display the sensing signal on the sub pixel.

That is, a voltage for turning off the channel may be applied to the sensing storage lines Vst1, Vst2, and Vst3. Further, a specific voltage to be applied to the sub pixel at the time of driving the sensor thin film transistor Tss may be applied to the sensing data lines Vdr1, Vdr2, Vdr3, and Vdr4. In this case, when strong light such as laser is incident onto the sensor thin film transistor Tss, the current Ioff of the sensor thin film transistor is increased and the voltage of the sensing data lines Vdr1, Vdr2, Vdr3, and Vdr4 is transmitted to the sub pixel. Therefore, the gray scale level by the sensing data lines Vdr1, Vdr2, Vdr3, and Vdr4 may be displayed in a laser incident area, that is, in the plurality of sub pixels.

In this case, according to the first exemplary embodiment of the present disclosure illustrated, one sensor thin film transistor Tss is provided in every sub pixel as an example, but the present disclosure is not limited thereto.

Further, referring to FIG. 3, each sub pixel B, G, and R includes an opening area where images are displayed by the pixel electrode 118 and the common electrode 108 and a non-opening area where no image is displayed and a driving element for driving the pixel electrode 118 and the common electrode 108 of the opening area, for example, the pixel thin film transistor TPx, or the like is disposed.

In the opening area, the pixel electrode 118 and the common electrode 108 may be disposed.

The pixel electrode 118 forms an electric field together with the common electrode 108 and makes the liquid crystal molecules of a liquid crystal layer tilted by the electric field formed as described above to display images. The pixel electrodes 118 may be disposed in parallel with the same interval and one ends of the plurality of pixel electrodes 118 may be connected to the pixel electrode line 1181 disposed in the first direction.

The pixel electrode 118 may be disposed not only in the opening area, but also extend to be disposed in the non-opening area.

The common electrodes 108 may be disposed in parallel with the same interval and one ends of the plurality of common electrodes 108 may be connected to the common electrode line 1081 disposed in the first direction. The common electrodes 108 and the pixel electrodes 118 may be alternately disposed in the opening area.

The pixel electrode line 1181 and the common electrode line 1081 may be disposed to be opposite to each other above or below the sub pixels B, G, R.

Further, the common electrode 108 may be disposed on the data lines DL2 and DL3 and the sensing data lines Vdr2 and Vdr3 so as to cover the data lines DL2 and DL3 and the sensing data lines Vdr2 and Vdr3. However, the present disclosure is not limited thereto.

In the non-opening area, the plurality of gate lines GL2 and GL3, the plurality of data lines DL2 and DL3, the plurality of common lines CL2 and CL3, the sensing data lines Vdr2 and Vdr3, the sensing storage line Vst2, the pixel thin film transistor TPx, the sensor thin film transistor Tss, and the storage capacitor may be disposed.

Further, even though not illustrated, a shielding line which shields light may be disposed in at least one side of the data lines DL2 and DL3 and the sensing data lines Vdr2 and Vdr3 disposed in the second direction so as to enclose the wiring lines.

As described above, the sensing data lines Vdr2 and Vdr3 disposed in the second direction are not disposed in a separate area, but may be disposed in an area where the data lines DL2 and DL3 are disposed in a normal display device which is not a DRD structure. Therefore, the display panel according to the first exemplary embodiment of the present disclosure does not need to design a separate wiring area to dispose the photo touch sensor. Therefore, the reduction of the aperture ratio may be minimized.

That is, in the display device according to the first exemplary embodiment of the present disclosure, the sub pixels B, G, and R are configured to have the DRD structure so that there is no need to prepare an area where separate sensing data lines Vdr2 and Vdr3 are disposed. Therefore, the reduction of the aperture ratio in the second direction may be minimized as compared with a case that the photo touch sensor is provided in the normal display device which is not a DRD structure.

The pixel thin film transistor TPx may include a first gate electrode 121a connected to the gate lines GL2 and GL3, a first active layer (not illustrated), a first source electrode 122a which is branched from the data lines DL2 and DL3, and a first drain electrode 123a which is spaced apart from the first source electrode 122a. In this case, the first drain electrode 123a may be electrically connected to the pixel electrode line 1181 through a first contact hole.

The sensing data lines Vdr2 and Vdr3 may be disposed between the data lines DL2 and DL3 and may be connected to the sensor thin film transistor Tss to apply a sensor driving signal or a sensor driving voltage to the sensor thin film transistor Tss. The sensor driving voltage which is applied to the sensor thin film transistor Tss may be applied from the touch drive circuit or the timing controller.

In this case, the sensor thin film transistor Tss may include a second gate electrode 121b connected to the sensing storage line Vst2, a second active layer, a second source electrode 122b branched from sensing data lines Vdr2 and Vdr3, and a second drain electrode 123b which is spaced apart from the second source electrode 122b.

In consideration of a wavelength range of a light source, the sensor thin film transistor Tss according to the present disclosure may be configured by a red sensor thin film transistor which is responsive to a red light source or a green sensor thin film transistor which is responsive to a green light source. However, the present disclosure is not limited thereto.

The sensor thin film transistor Tss may be provided in both sub pixels of sub pixels B, G, R to be symmetrical with respect to the sensing data lines Vdr2 and Vdr3. However, the present disclosure is not limited thereto.

A cross-sectional structure of the display panel configured as described above will be described in more detail.

Figure 4A:
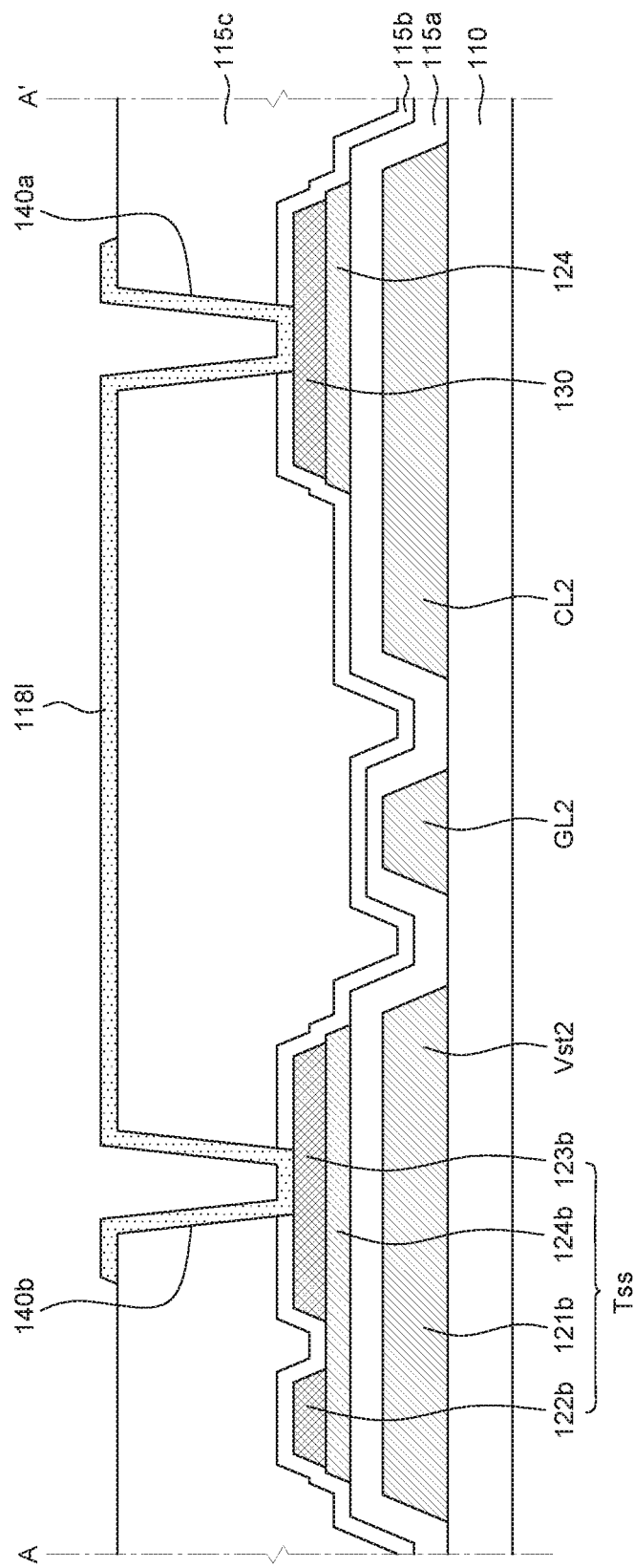
FIG. 4A is a cross-sectional view of a display panel illustrated in FIG. 3 taken along the line A-A'.

FIG. 4A is a cross-sectional view of a display panel illustrated in FIG. 3 taken along the line A-A'.

Figure 4B:
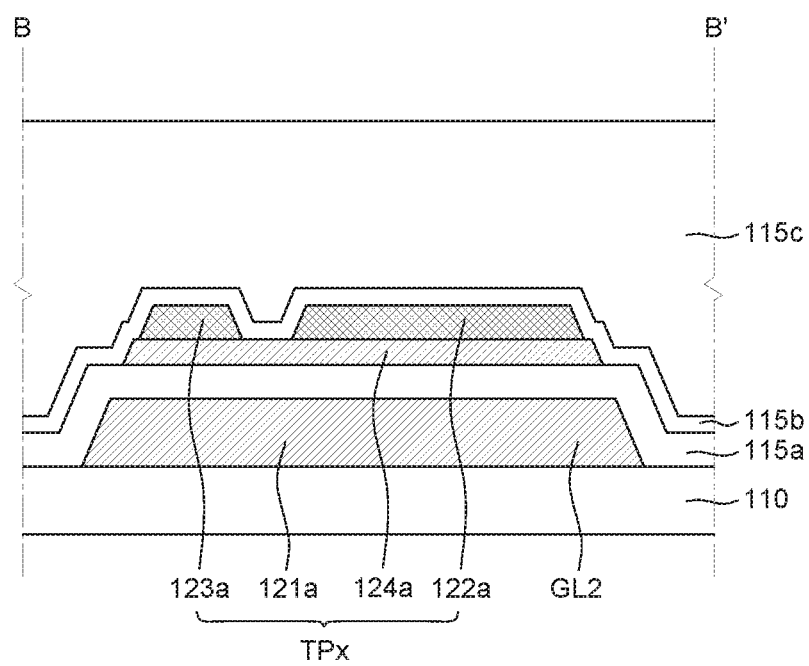
FIG. 4B is a cross-sectional view of a display panel illustrated in FIG. 3 taken along the line B-B'.

FIG. 4B is a cross-sectional view of a display panel illustrated in FIG. 3 taken along the line B-B'.

In this case, a sensor thin film transistor is illustrated at a left side of FIG. 4A and a storage capacitor is illustrated at a right side. Further, in FIG. 4B, the pixel thin film transistor is illustrated as an example, but the present disclosure is not limited thereto.

Referring to FIGS. 4A and 4B, a first gate electrode 121a, a second gate electrode 121b, a sensing storage line Vst2, a gate line GL2, and a common line CL2 may be disposed on the substrate 110.

The sensing storage line Vst2 may be disposed on the substrate 110 together with the gate line GL2 and the common line CL2 in the first direction.

In this case, the first gate electrode 121a is branched from the gate line GL2 to configure a part of the gate line GL2.

Further, the second gate electrode 121b may be branched from the sensing storage line Vst2 to configure a part of the sensing storage line Vst2.

The first gate electrode 121a, the second gate electrode 121b, the sensing storage line Vst2, the gate line GL2, and the common line CL2 may be formed of the same material, for example, may be formed of any one selected from the group consisting of molybdenum (Mo), aluminum (Al), chrome (Cr), gold (Au), titanium (Ti), nickel (Ni), copper (Cu), and neodymium (Nd), or an alloy thereof.

A gate insulating layer 115a may be disposed on the first gate electrode 121a, the second gate electrode 121b, the sensing storage line Vst2, the gate line GL2, and the common line CL2. The gate insulating layer 115a may be formed of a silicon oxide film SiOx, a silicon nitride film SiNx, or a plurality of layers thereof.

A first active layer 124a, a second active layer 124b, and a semiconductor layer 124 may be disposed on the gate insulating layer 115a.

The first active layer 124a, the second active layer 124b, and the semiconductor layer 124 may be formed of any one semiconductor material of an amorphous silicon, polycrystalline silicon, a low-temperature polysilicon, an oxide semiconductor, and the like.

The first active layer 124a and the second active layer 124b may be formed of different semiconductor materials. For example, the first active layer 124a may be formed of an oxide semiconductor and the second active layer 124b may be formed of amorphous silicon. However, the present disclosure is not limited thereto.

The oxide semiconductor may be formed by a material obtained by adding silicon (Si) to an oxide semiconductor including one or more selected from the group consisting of germanium (Ge), tin (Sn), lead (Pb), indium (In), titanium (Ti), gallium (Ga), and aluminum (Al) and zinc (Zn). For example, the first active layer 124a may be formed of silicon indium zinc oxide (Si—InZnO SIZO) in which silicon ions are added to the indium zinc composite oxide (InZnO).

For example, when the first active layer 124a is formed of SiZO, a composition ratio of the silicon (Si) atom content to a total content of zinc (Zn), indium (In) and silicon (Si) atoms in the first active layer 124a is approximately 0.001 wt % to approximately 30 wt %. As the silicon (Si) atom content is increased, a function of controlling electron generation becomes stronger so that the mobility may be lowered, but the stability of the element may be improved.

Examples of the oxide semiconductor include a group I element such as lithium (Li) or potassium (K), a group II element such as magnesium (Mg), calcium (Ca), or strontium (Sr), a group III element such as gallium (Ga), aluminum (Al), indium (In) or yttrium (Y), a group IV element such as titanium (Ti), zirconium (Zr), silicon (Si), tin (Sn) or germanium (Ge), a group V element such as tantalum (Ta), vanadium (V), niobium (Nb) or antimony (Sb), and a lanthanum (Ln) based element such as lanthanum (La), cerium (Ce), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), praseodymium (Pr) or ruthenium (Lu), in addition to the above-described material.

The first source electrode 122a branched from the data line and the first drain electrode 123a spaced apart from the first source electrode 122a may be disposed on the first active layer 124a.

Further, the storage electrode 130 extending from the first drain electrode 123a may be disposed on the semiconductor layer 124. The storage electrode 130 overlaps the common line CL above the common line CL to configure a pixel storage capacitor.

Further, the second source electrode 122b branched from the sensing data line and the second drain electrode 123b spaced apart from the second source electrode 122b may be disposed on the second active layer 124b. The second drain electrode 123b is electrically connected to the first drain electrode 123a to share the pixel storage capacitor.

The first gate electrode 121a, the first source electrode 122a, the first drain electrode 123a, and the first active layer 124a may configure the pixel thin film transistor TPx. That is, the first source electrode 122a serves as a first electrode of the pixel thin film transistor TPx and the first drain electrode 123a serves as a second electrode of the pixel thin film transistor TPx.

The second gate electrode 121b, the second source electrode 122b, the second drain electrode 123b, and the second active layer 124b may configure the sensor thin film transistor Tss. In this case, the second source electrode 122b serves as a second electrode of the sensor thin film transistor Tss and the second drain electrode 123b serves as a first electrode of the sensor thin film transistor Tss.

In this case, the sensor thin film transistor Tss may configure a red sensor thin film transistor which is responsive to the red light source or a green sensor thin film transistor which is responsive to the green light source.

The first source electrode 122a, the first drain electrode 123a, the storage electrode 130, the second source electrode 122b, the second drain electrode 123b, the data line, and the sensing data line may be formed of any one selected from the group consisting of molybdenum (Mo), aluminum (Al), chrome (Cr), gold (Au), titanium (Ti), nickel (Ni), neodymium (Nd), and copper (Cu) or an alloy thereof.

Further, an interlayer insulating layer 115b may be disposed on the first source electrode 122a, the first drain electrode 123a, the storage electrode 130, the second source electrode 122b, the second drain electrode 123b, the data line, and the sensing data line.

In this case, the interlayer insulating layer 115b is provided to insulate the first source electrode 122a, the first drain electrode 123a, the storage electrode 130, the second source electrode 122b, the second drain electrode 123b, the data line, and the sensing data line from configurations disposed thereon. For example, the interlayer insulating layer 115b may be formed of a silicon oxide film SiOx, a silicon nitride film SiNx, or a plurality of layers thereof.

Even though not illustrated in the drawings, a color filter layer formed of red, green, and blue color filters may be disposed on the interlayer insulating layer 115b of the opening area. The color filter layer may not be disposed in the non-opening area or two or more color filters are laminated to be used as a blocking layer. The blocking layer may be configured by the lamination of the red color filter and the blue color filter, but the present disclosure is not limited thereto.

For example, the red color filter and the blue color filter may be laminated on the entire substrate 110 excluding a part corresponding to first and second contact holes 140a and 140b to be described below. However, the present disclosure is not limited thereto and the red color filter and the blue color filter may be patterned through the first and second contact holes 140a and 140b after being laminated on the entire substrate 110.

A planarizing layer 115c may be disposed on the color filter layer.

The planarization layer 115c is provided to planarize a step therebelow, for example, may be formed of an organic material such as photo acryl, polyimide, acrylate-based resin, or benzocyclobutene-based resin.

A pixel electrode and a common electrode may be disposed on the planarization layer 115c.

Further, the pixel electrode line 1181 and the common electrode line may be disposed on the planarization layer 115c.

In this case, a part of the planarization layer 115c and the interlayer insulating layer 115b is removed to form a first contact hole 140a which exposes the storage electrode 130 therebelow. Further, another part of the planarization layer 115c and the interlayer insulating layer 115b is removed to form a second contact hole 140b which exposes the second drain electrode 123b therebelow.

Therefore, the storage electrode 130 is exposed to the outside through the first contact hole 140a and the second drain electrode 123b may be exposed to the outside through the second contact hole 140b.

The storage electrode 130 is electrically connected to the pixel electrode line 1181 through the first contact hole 140a and the second drain electrode 123b is electrically connected to the pixel electrode line 1181 through the second contact hole 140b. Therefore, the storage electrode 130 and the second drain electrode 123b may be connected to each other.

The pixel electrode forms an electric field together with the common electrode and makes the liquid crystal molecules of a liquid crystal layer tilted by the electric field formed as described above to display images. The pixel electrodes may be disposed in parallel with the same interval and one ends of the plurality of pixel electrodes may be connected to the pixel electrode line 1181 disposed in the first direction. The pixel electrode may be disposed not only in the opening area, but also extend to be disposed in the non-opening area.

The common electrodes may be disposed in parallel with the same interval and one ends of the plurality of common electrodes may be connected to the common electrode line disposed in the first direction. The common electrodes and the pixel electrodes may be alternately disposed in the opening area.

The common electrodes and the pixel electrodes may be disposed on the same layer, but the present disclosure is not limited thereto and may be disposed on different layers.

The common electrode, the pixel electrode, the pixel electrode line 1181, and the common electrode line may be formed of a transparent conductive layer. The transparent conductive layer may be a material which is transparent and has a conductivity, such as indium tin oxide (ITO) or indium zinc oxide (IZO).

As described above, according to the first exemplary embodiment of the present disclosure, a leakage current is generated in the second active layer 124*b* in response of a predetermined light source which is incident onto the sensor thin film transistor Tss and the generated leakage current may be stored in the pixel storage capacitor.

When a predetermined voltage is applied to the sensing data line, a predetermined image may be displayed in a corresponding sub pixel by the leakage current stored in the pixel storage capacitor.

Therefore, the present disclosure provides effects that the photo-sensing and the self-image expression are possible and a visibility of a laser pointer is improved. Specifically, according to the first exemplary embodiment of the present disclosure, only a sensor thin film transistor Tss is added without adding a separate circuit or performing signal process, so that it is advantageous in that a process and a cost are saved.

According to the first exemplary embodiment of the present disclosure, a predetermined image is displayed in the corresponding sub pixel instead of the lead-out line to implement photo sensing. Therefore, it is not affected by the noise due to the transition of the data signal so that it is advantageous to increase a size and a resolution of the panel. Further, the sensor thin film transistor Tss is disposed for every sub pixel to increase a photo-sensing precision.

In this case, according to the first exemplary embodiment of the present disclosure illustrated, one sensor thin film transistor Tss is disposed in every sub pixel as an example, but the present disclosure is not limited thereto. However, the present disclosure is also applied to an example that one sensor thin film transistor Tss is disposed in every two sub pixels, which will be described in more detail by means of a second exemplary embodiment of the present disclosure.

Figure 5:
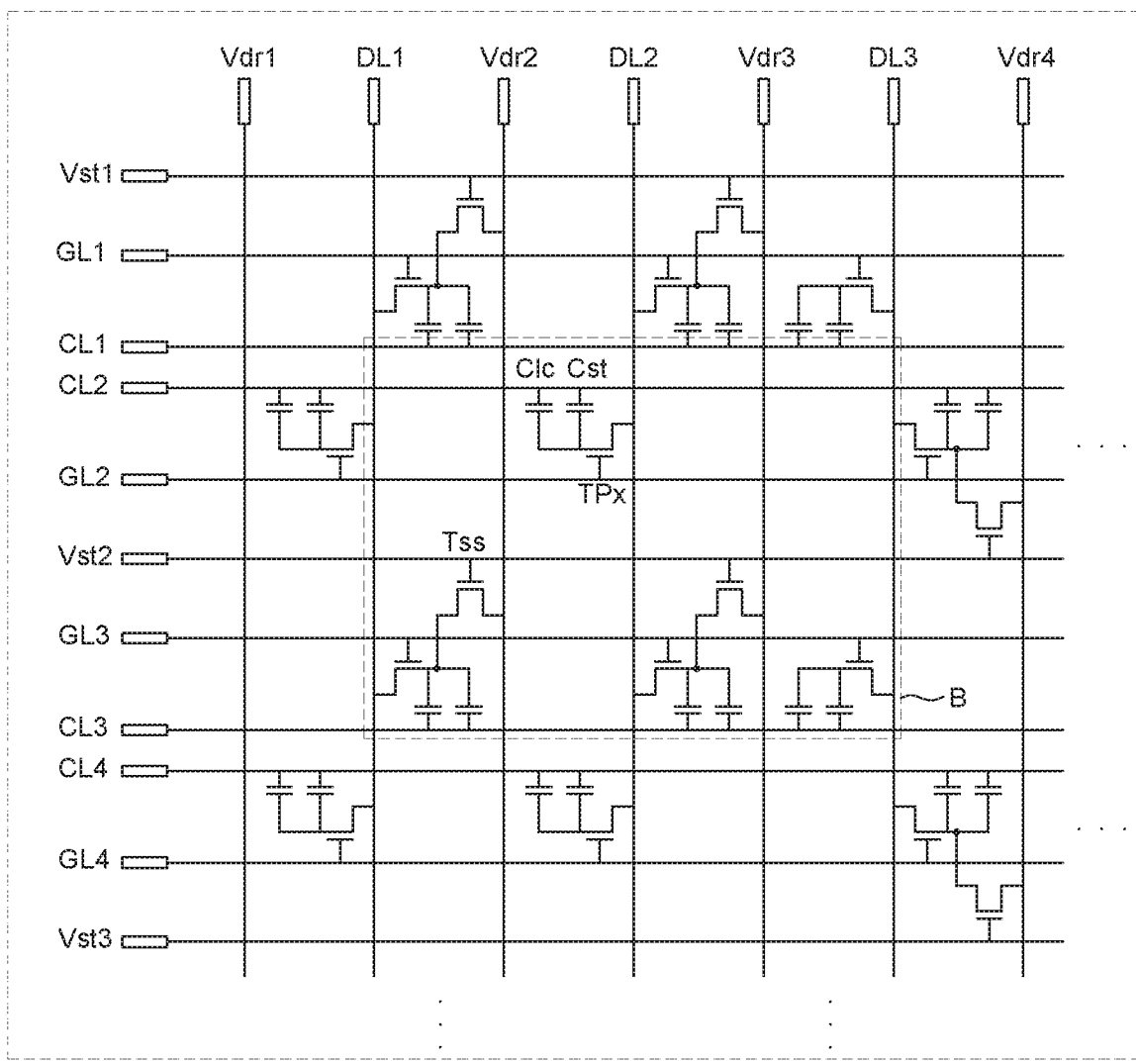
FIG. 5 is an equivalent circuit diagram illustrating a part of a display panel according to a second exemplary embodiment of the present disclosure.

FIG. 5 is an equivalent circuit diagram illustrating a part of a display panel according to a second exemplary embodiment of the present disclosure.

According to a second exemplary embodiment of the present disclosure illustrated in FIG. 5, one sensor thin film transistor is provided in every two sub pixels as an example, but the present disclosure is not limited thereto.

Figure 6:
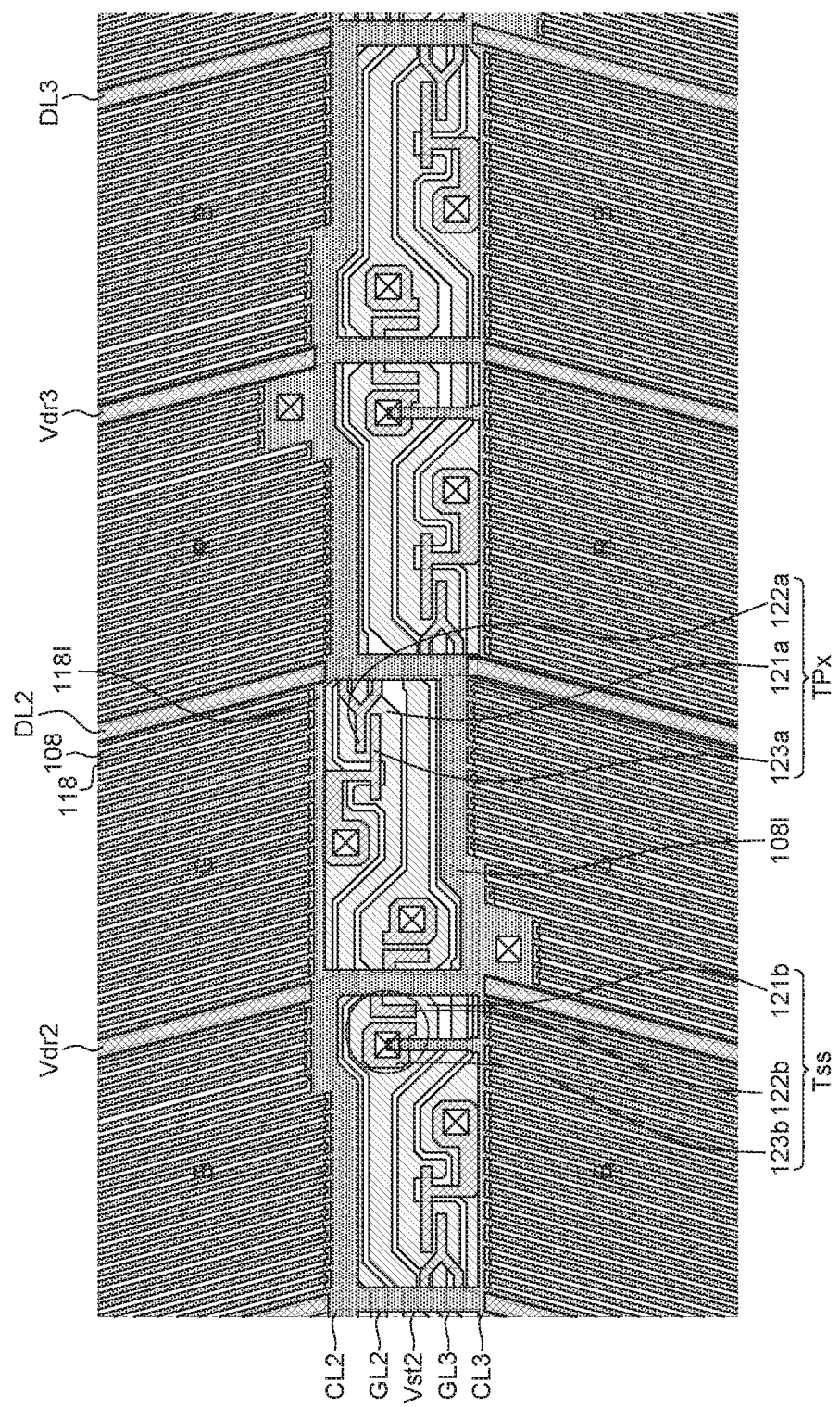
FIG. 6 is a plan view illustrating a part of a display panel according to a second exemplary embodiment of the present disclosure.

FIG. 6 is a plan view illustrating a part of a display panel according to a second exemplary embodiment of the present disclosure. FIG. 6 schematically illustrates a planar structure of a display panel for a part B of FIG. 5. For example, FIG. 6 illustrates some of eight sub pixels. In FIG. 6, for example, a blue sub pixel B, a green sub pixel G, and a red sub pixel R are sequentially and repeatedly disposed, but the present disclosure is not limited thereto.

First, referring to FIG. 5, in a display panel according to the second exemplary embodiment of the present disclosure, a plurality of sub pixels is disposed to display images and one sensor thin film transistor Tss is disposed in every two sub pixels to sense incident light and recognize the touch.

Even though not specifically illustrated, a plurality of sub pixels is disposed in the display panel and each of the sub pixels may be any one of red, green, and blue sub pixels.

The plurality of sub pixels may be disposed to have a double rate driving (DRD) structure. More specifically, sub pixels which are disposed to be adjacent, among the plurality of sub pixels, for example, a sub pixel in a first column and a sub pixel in a second column are electrically connected to the same data line of data lines DL1, DL2, and DL3, such as a first data line DL1. Further, a sub pixel in a first row and a sub pixel in a second row may be connected to different gate lines GL1, GL2, GL3, and GL4, for example, to the first gate line GL1 and the second gate line GL2, respectively.

In this case, since the sub pixels have a DRD structure, when a vertical common line is disposed between the data lines DL1, DL2, and DL3 other than the common line CL1, CL2, CL3, and CL4, a total resistance of the common lines CL1, CL2, CL3, and CL4 may be drastically reduced. However, the present disclosure is not limited thereto.

As descried above, the common lines CL1, CL2, CL3, and CL4, the gate lines GL1, GL2, GL3, and GL4, and the sensing storage lines Vst1, Vst2, Vst3 may be provided in the first direction.

Further, the data lines DL1, DL2, and DL3 and the sensing data lines Vdr1, Vdr2, Vdr3, and Vdr4 may be provided in a second direction which is different from the first direction.

The sensing data lines Vdr1, Vdr2, Vdr3, and Vdr4 are wiring lines which transmit a sensor data signal, that is, a photo touch sensor driving signal to the sensor thin film transistor Tss.

Referring to FIG. 5, each of the plurality of sub pixels P includes a pixel thin film transistor TPx, a pixel capacitor Clc and a pixel storage capacitor Cst which are connected to the pixel thin film transistor TPx in parallel.

Further, each sub pixel according to the second exemplary embodiment of the present disclosure further includes a sensor thin film transistor Tss connected to the pixel storage capacitor Cst for every two sub pixels.

Even though not illustrated in the drawing, each sub pixel is configured by a pixel electrode electrically connected to the pixel thin film transistor TPx, a common electrode which supplies a common voltage, and a liquid crystal layer in which liquid crystals are tilted by a vertical electric field or a horizontal electric field by the pixel electrode and the common electrode.

In this case, the pixel thin film transistor TPx stores a data signal which is applied from the data lines DL1, DL2, and DL3 in response to a gate signal applied from the gate lines GL1, GL2, GL3, and GL4 in the pixel capacitor Clc and the pixel storage capacitor Cst.

As described above, the liquid crystals are driven in accordance with the data signal stored in the pixel capacitor Clc and the pixel storage capacitor Cst may stably maintain a data signal of the pixel capacitor Clc.

In this case, it has been described that the display panel according to the second exemplary embodiment is a liquid crystal panel as an example, but the present disclosure is not limited thereto. For example, the display panel according to the second exemplary embodiment of the present disclosure may be an organic light emitting display panel. When the display panel is an organic light emitting display panel, the organic light emitting display panel may include an anode connected to the pixel thin film transistor TPx, a light emitting layer formed of an organic material, and a cathode.

As described above, the second exemplary embodiment of the present disclosure includes the sensing data lines Vdr1, Vdr2, Vdr3, and Vdr4 and the sensing storage lines Vst1, Vst2, and Vst3.

Further, the pixel thin film transistor TPx and the sensor thin film transistor Tss share a storage capacitor, that is, the pixel storage capacitor Cst so that the photo sensing is possible without using a separate circuit such as a lead-out line or performing the signal processing. Further, according to the second exemplary embodiment of the present disclosure, the sensor storage and the pixel storage are shared to display the sensing signal on the sub pixel.

That is, a voltage for turning off the channel may be applied to the sensing storage lines Vst1, Vst2, and Vst3. Further, a specific voltage to be applied to the sub pixel at the time of driving the sensor thin film transistor Tss may be applied to the sensing data lines Vdr1, Vdr2, Vdr3, and Vdr4. In this case, when strong light such as laser is incident onto the sensor thin film transistor Tss, the off current Ioff of the sensor thin film transistor is increased and the voltage of the sensing data lines Vdr1, Vdr2, Vdr3, and Vdr4 is transmitted to the sub pixel. Therefore, the gray scale level by the sensing data lines Vdr1, Vdr2, Vdr3, and Vdr4 may be displayed in a laser incident area, that is, in a plurality of sub pixels.

In this case, according to the second exemplary embodiment of the present disclosure illustrated, one sensor thin film transistor Tss is provided in every two sub pixels as an example, but the present disclosure is not limited thereto.

Further, referring to FIG. 6, each sub pixel B, G, and R includes an opening area where images are displayed by the pixel electrode 118 and the common electrode 108 and a non-opening area where no image is displayed and a driving element for driving the pixel electrode 118 and the common electrode 108 of the opening area, for example, the pixel thin film transistor TPx is disposed.

In the opening area, the pixel electrode 118 and the common electrode 108 may be disposed.

The pixel electrode 118 forms an electric field together with the common electrode 108 and makes the liquid crystal molecules of a liquid crystal layer tilted by the electric field formed as described above to display images. The pixel electrodes 118 may be disposed in parallel with the same interval and one ends of the plurality of pixel electrodes 118 may be connected to the pixel electrode line 1181 disposed in the first direction.

The pixel electrode 118 may be disposed not only in the opening area, but also extend to be disposed in the non-opening area.

The common electrodes 108 may be disposed in parallel with the same interval and one ends of the plurality of common electrodes 108 may be connected to the common electrode line 1081 disposed in the first direction. The common electrodes 108 and the pixel electrodes 118 may be alternately disposed in the opening area.

The pixel electrode line 1181 and the common electrode line 1081 may be disposed to be opposite to each other above or below the sub pixels B, G, R.

Further, the common electrode 108 may be disposed on the data lines DL2 and DL3 and the sensing data lines Vdr2 and Vdr3 so as to cover the data lines DL2 and DL3 and the sensing data lines Vdr2 and Vdr3. However, the present disclosure is not limited thereto.

In the meantime, in the non-opening area, the plurality of gate lines GL2 and GL3, the plurality of data lines DL2 and DL3, the plurality of common lines CL2 and CL3, the sensing data lines Vdr2 and Vdr3, the sensing storage line Vst2, the pixel thin film transistor TPx, the sensor thin film transistor Tss, and the storage capacitor may be disposed.

Further, even though not illustrated, a shielding line which shields light may be disposed in at least one side of the data lines DL2 and DL3 and the sensing data lines Vdr2 and Vdr3 disposed in the second direction so as to enclose the wiring lines.

As described above, the sensing data lines Vdr2 and Vdr3 disposed in the second direction are not disposed in a separate area, but may be disposed in an area where the data lines DL2 and DL3 are disposed in a normal display device which is not a DRD manner. Therefore, the display panel according to the second exemplary embodiment of the present disclosure does not need to design a separate wiring area to dispose the photo touch sensor. Therefore, the reduction of the aperture ratio may be minimized.

That is, in the display device according to the second exemplary embodiment of the present disclosure, the sub pixels B, G, and R are configured to have the DRD structure so that there is no need to prepare an area where separate sensing data lines Vdr2 and Vdr3 are disposed. Therefore, the reduction of the aperture ratio in the second direction may be minimized as compared with a case that the photo touch sensor is provided in the normal display device which is not a DRD structure.

The pixel thin film transistor TPx may include a first gate electrode 121a connected to the gate lines GL2 and GL3, a first active layer (not illustrated), a first source electrode 122a which is branched from the data lines DL2 and DL3, and a first drain electrode 123a which is spaced apart from the first source electrode 122a. In this case, the first drain electrode 123a may be electrically connected to the pixel electrode line 1181 through the first contact hole.

The sensing data lines Vdr2 and Vdr3 are disposed between the data lines DL2 and DL3 and are connected to the sensor thin film transistor Tss to apply a sensor driving signal or a sensor driving voltage to the sensor thin film transistor Tss. The sensor driving voltage which is applied to the sensor thin film transistor Tss may be applied from the touch drive circuit or the timing controller.

In this case, the sensor thin film transistor Tss may include a second gate electrode 121b connected to the sensing storage line Vst2, a second active layer, a second source electrode 122b branched from the sensing data lines Vdr2 and Vdr3, and a second drain electrode 123b which is spaced apart from the second source electrode 122b.

In consideration of a wavelength range of a light source, the sensor thin film transistor Tss according to the present disclosure may be configured by a red sensor thin film transistor which is responsive to a red light source or a green sensor thin film transistor which is responsive to a green light source. However, the present disclosure is not limited thereto.

The sensor thin film transistor Tss may be provided in both sub pixels of sub pixels B, G, R to be symmetrical with respect to the sensing data lines Vdr2 and Vdr3. However, according to the second exemplary embodiment of the present disclosure, in one sub pixel, for example, as illustrated in FIG. 6, in an even-numbered sub pixel, the sensor thin film transistor Tss is not connected to the pixel storage capacitor, that is, the pixel electrode line 1181. In contrast, in the other sub pixel, for example, in an odd-numbered sub pixel, the sensor thin film transistor Tss is connected to the pixel electrode line 1181.

In the meantime, according to the present disclosure, various color images may be disposed in the sub pixel which is photo-sensed, in accordance with a voltage which is applied to the sensing data line and an arrangement design of the sensing data line, which will be described in more detail with reference to the drawings.

Figures 7A, 7B:
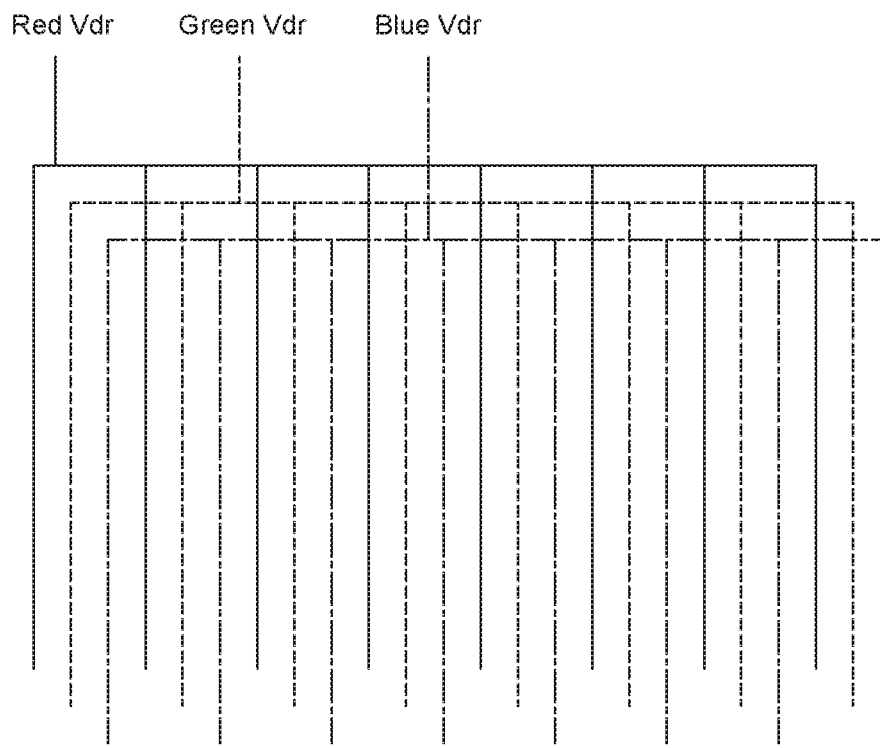
FIG. 7A is a view illustrating an arrangement of a sensing data line.
FIG. 7B is a table listing an image result in accordance with a sensing data voltage condition, in a display device according to first and second exemplary embodiments of the present disclosure.

FIG. 7A is a view illustrating an arrangement of a sensing data line.

FIG. 7B is a table listing an image result in accordance with a sensing data voltage condition, in a display device according to first and second exemplary embodiments of the present disclosure.

Referring to FIG. 7A, for example, the sensing data lines Red Vdr, Green Vdr, and Blue Vdr according to the present disclosure may apply a sensing data voltage (Vdr voltage) to red, green, and blue sub pixels respectively through three external lines for every red sub pixel, green sub pixel, and blue sub pixel.

Referring to FIG. 7B, it is understood that when a predetermined Vdr voltage is applied to every red sub pixel, green sub pixel, and blue sub pixel R, G, and B, various color images are displayed, according to the first and second exemplary embodiments of the present disclosure.

According to the first exemplary embodiment in which one sensor thin film transistor is disposed every sub pixel (R, G, and B), magenta, yellow, cyan, black, or white color may be implemented.

According to the second exemplary embodiment in which one sensor thin film transistor is disposed every two sub pixels (R, G, and B), red, green, blue, black, or white color may be implemented.

For example, as represented in Case 1, it is understood that when a common voltage Vcom is applied to the red, green, and blue sub pixels R, G, and B, as a Vdr voltage, according to the first and second exemplary embodiments, black is displayed as both a dot color and an implemented color.

As represented in Case 2, when a 255 gray pixel driving voltage Vdd and a common voltage Vcom are applied to the red sub pixel R and the green and blue sub pixels G and B, respectively, as a Vdr voltage, according to the first exemplary embodiment, red+blue and magenta are displayed as a dot color and an implemented color, respectively. However, according to the second exemplary embodiment, the red color is displayed as both the dot color and the implemented color.

As represented in Case 3, when a 255 gray pixel driving voltage Vdd and a common voltage Vcom are applied to the green sub pixel G and the red and blue sub pixels R and B, respectively, as a Vdr voltage, according to the first exemplary embodiment, green+red and yellow are displayed as a dot color and an implemented color, respectively. However, according to the second exemplary embodiment, the green color is displayed as both the dot color and the implemented color.

As represented in Case 4, when a 255 gray pixel driving voltage Vdd and a common voltage Vcom are applied to the blue sub pixel B and the red and green sub pixels R and G, respectively, as a Vdr voltage, according to the first exemplary embodiment, blue+green and cyan are displayed as a dot color and an implemented color, respectively. However, according to the second exemplary embodiment, the blue color is displayed as both the dot color and the implemented color.

For example, as represented in Case 5, when a 255 gray pixel driving voltage Vdd is applied to the red, green, and blue sub pixels R, G, and B, as a Vdr voltage, according to the first and second exemplary embodiments, white is displayed as both a dot color and an implemented color.

Figures 8A, 8B:
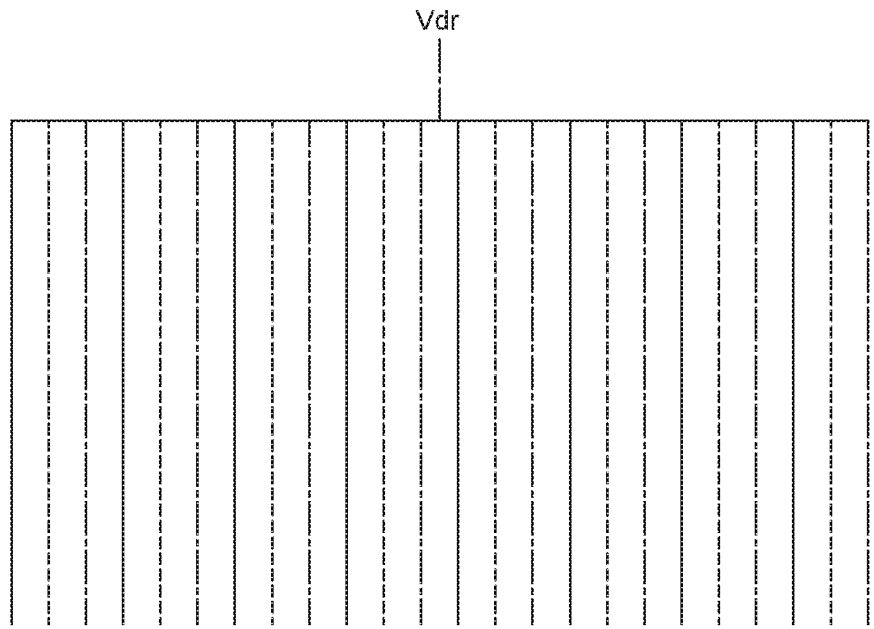
FIG. 8A is a view illustrating another arrangement of a sensing data line.
FIG. 8B is a table listing an image result in accordance with a sensing data voltage condition, in a display device according to a first exemplary embodiment of the present disclosure.

FIG. 8A is a view illustrating another arrangement of a sensing data line.

FIG. 8B is a table listing an image result in accordance with a sensing data voltage condition, in a display device according to a first exemplary embodiment of the present disclosure.

Referring to FIG. 8A, for example, the sensing data lines Vdr according to the present disclosure may apply a sensing data voltage (Vdr voltage) to red, green, and blue sub pixels through one external line for every sub pixel, regardless of the red sub pixel, the green sub pixel, and the blue sub pixel.

Referring to FIG. 8B, it is understood that when a predetermined Vdr voltage is applied to every red sub pixel, green sub pixel, and blue sub pixel R, G, and B, black or white images are displayed, according to the first exemplary embodiment of the present disclosure.

For example, as represented in Case 1, it is understood that when a common voltage Vcom is applied to the red, green, and blue sub pixels R, G, and B, as a Vdr voltage, according to the first exemplary embodiment, black is displayed as both a dot color and an implemented color.

Further, as represented in Case 2, when a 255 gray pixel driving voltage Vdd is applied to the red, green, and blue sub pixels R, G, and B, as a Vdr voltage, according to the first exemplary embodiments, white is displayed as both a dot color and an implemented color.

Hereinafter, when a dot image is implemented with white, a charging simulation result in accordance with a sensing data voltage condition will be described in more detail.

Figure 9:
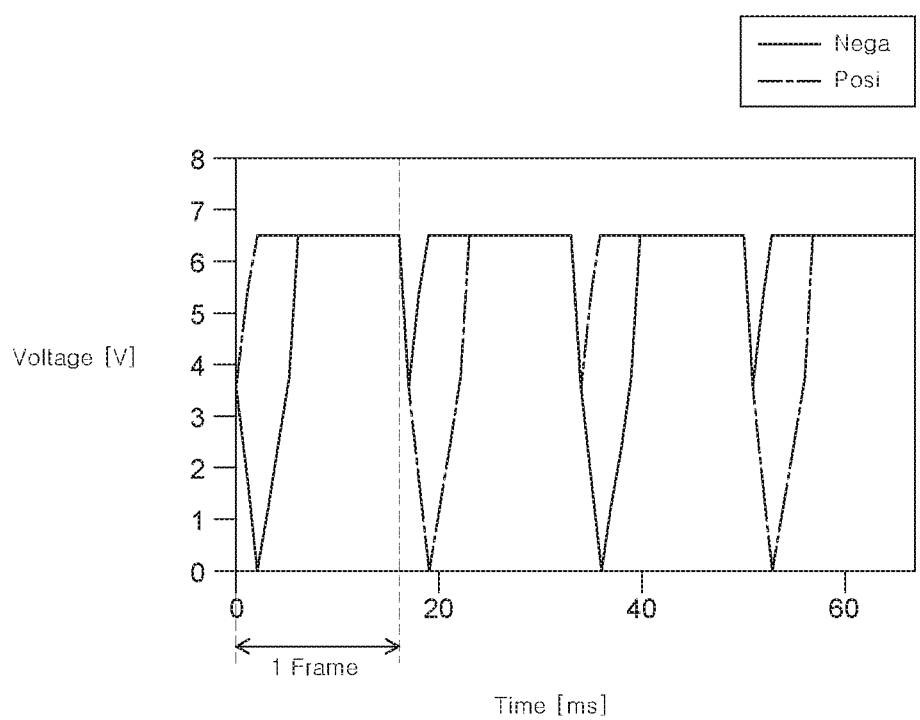
FIG. 9 is a graph illustrating a ripple of a voltage in accordance with a time, in the case of a 127 gray background.

FIG. 9 is a graph illustrating a ripple of a voltage in accordance with a time, in the case of a 127 gray background.

Figure 10A:
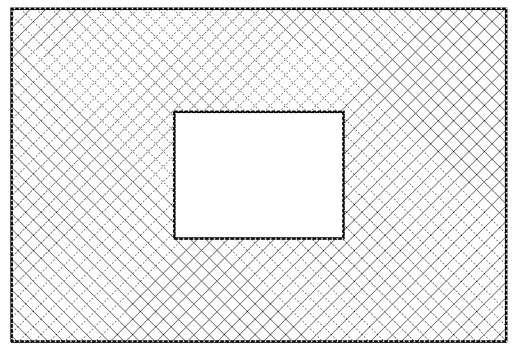
FIGS. 10A to 10C are views illustrating an image predicted in FIG. 9.
Figure 10B:
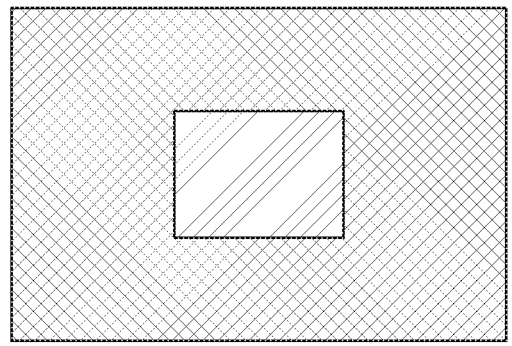
Figure 10C:
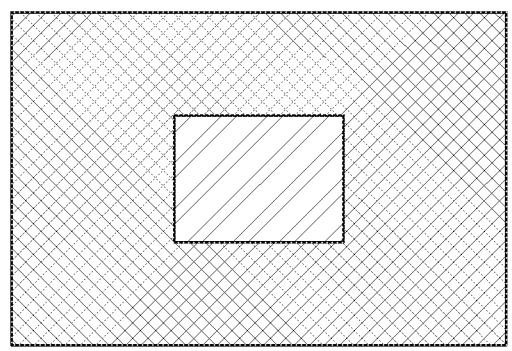

FIGS. 10A to 10C are views illustrating an image predicted in FIG. 9.

Referring to FIGS. 10A to 10C, white, red, and green are displayed in a 127 gray background, as a dot image.

In the 127 gray background in which a pixel charging voltage is 127 gray and a liquid crystal voltage Vlc is 3.6 V, as illustrated in FIG. 9, it is understood that when approximately 13 V is applied as a sensing data voltage, a sub pixel which is charged with a positive polarity is charged within approximately 2 ms.

In contrast, in the case of a negative polarity, as the voltage is increased, the luminance is reduced to a common voltage Vcom level and then increased to be charged within approximately 6 ms.

For example, when it is assumed that a diameter of the laser pointer is 2 mm, approximately 9×3 dot sub-pixels are included so that an image may be expressed with an average luminance with positive/negative polarities which varies during one frame.

In this case, when the frame is changed, the sub pixel is refreshed so that it may be recognized as a self-image flickering phenomenon.

Figure 11:
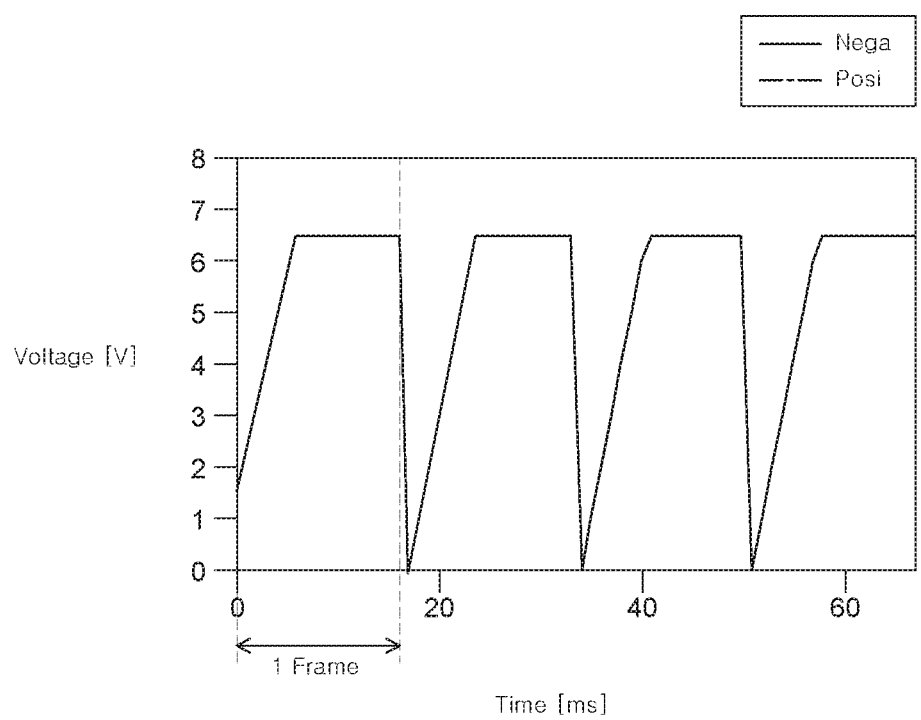
FIG. 11 is a graph illustrating a ripple of a voltage in accordance with a time, in the case of a 0 gray background.

FIG. 11 is a graph illustrating a ripple of a voltage in accordance with a time, in the case of a 0 gray background.

Figure 12A:
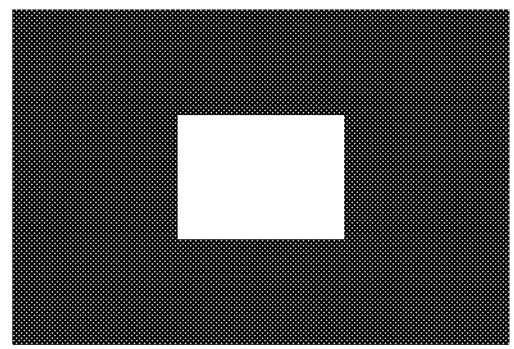
FIGS. 12A to 12C are views illustrating an image predicted in FIG. 11.
Figure 12B:
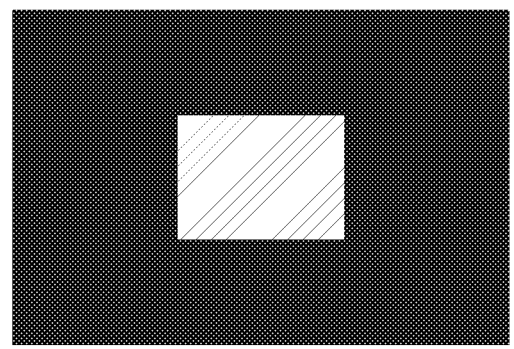
Figure 12C:
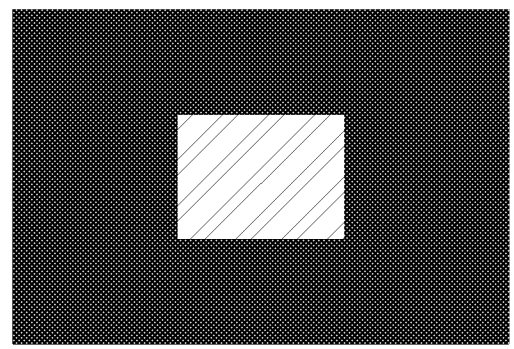

FIGS. 12A to 12C are views illustrating an image predicted in FIG. 11.

Referring to FIGS. 12A to 12C, white, red, and green are displayed in a 0 gray background, as a dot image.

In the 0 gray background in which a pixel charging voltage is 0 gray and an average voltage Vrms is 6.5 V, as illustrated in FIG. 11, it is understood that when approximately 13 V is applied as a sensing data voltage, a sub pixel may be charged at the same timing regardless of the positive polarity and the negative polarity.

In this case, it is understood that approximately 7 ms is required to be fully charged by increasing the voltage from 0 V with respect to an average voltage Vrms.

Also in this case, when the frame is changed, the sub pixel is refreshed so that it may be recognized as a self-image flickering phenomenon.

Hereinafter, when a dot image is implemented with black, a charging simulation result in accordance with a sensing data voltage condition will be described in more detail.

Figure 13:
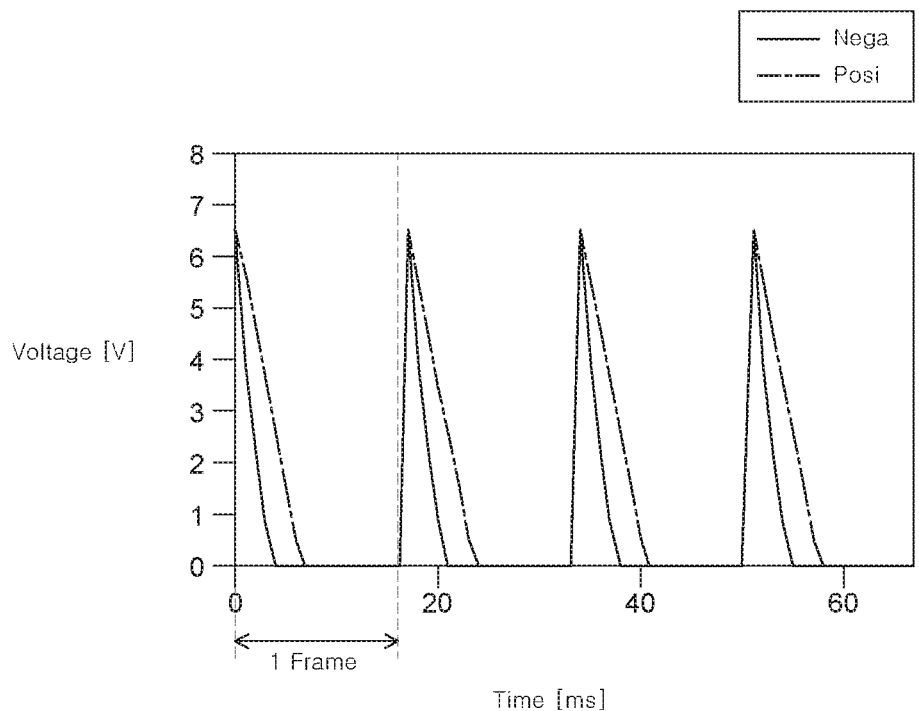
FIG. 13 is a graph illustrating a ripple of a voltage in accordance with a time, in the case of a 225 gray background.

FIG. 13 is a graph illustrating a ripple of a voltage in accordance with a time, in the case of a 255 gray background.

Figure 14:
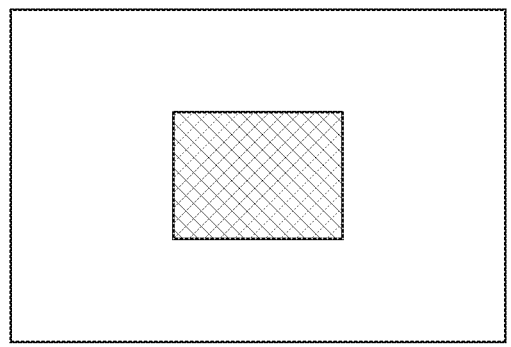
FIG. 14 is a view illustrating an image predicted in FIG. 13.

FIG. 14 is a view illustrating an image predicted in FIG. 13.

FIG. 14 illustrates an example that black is displayed on a 255 gray background as a dot image.

In the 255 gray background in which a pixel charging voltage is 255 gray and an average voltage Vrms is 6.5 V, as illustrated in FIG. 13, it is understood that when approximately 6.5 V is applied as a sensing data voltage, a deviation is caused in the discharging depending on a positive polarity and a negative polarity and it is fully discharged within approximately 7 ms.

Similarly to the white image implementation, when the frame is changed by the luminance deviation in accordance with the positive polarity and the negative polarity, it may be recognized as a self-image flickering phenomenon.

In the case of a black image expression, it may be displayed as an image of approximately 71 gray levels.

Figure 15:
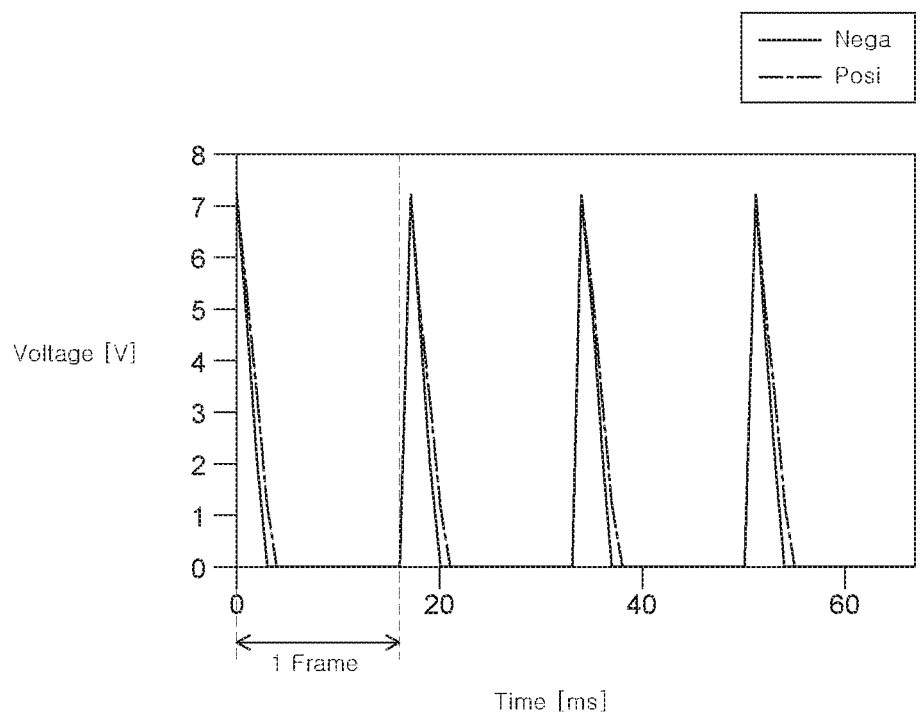
FIG. 15 is a graph illustrating a ripple of a voltage in accordance with a time, in the case of a 127 gray background.

FIG. 15 is a graph illustrating a ripple of a voltage in accordance with a time, in the case of a 127 gray background.

Figure 16:
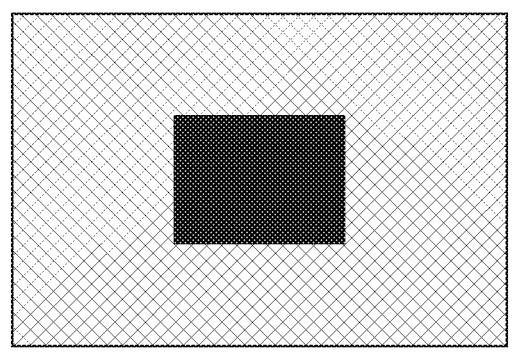
FIG. 16 is a view illustrating an image predicted in FIG. 15.

FIG. 16 is a view illustrating an image predicted in FIG. 15.

FIG. 16 illustrates an example that black is displayed on a 127 gray background as a dot image.

In the 127 gray background in which a pixel charging voltage is 127 gray and an average voltage Vrms is 6.5 V, as illustrated in FIG. 15, it is understood that when approximately 6.5 V is applied as a sensing data voltage, a discharging deviation in accordance with a positive polarity and a negative polarity is hardly generated and it is fully discharged within approximately 4 ms.

In the case of a black image expression, it may be displayed as an image of approximately 14 gray levels.

As described above, according to the present disclosure, the sub pixels which are charged or discharged by all light sources are refreshed in accordance with the change of the frame to be flickered.

The exemplary embodiments of the present disclosure can also be described as follows:

According to an aspect of the present disclosure, there is provided a display device. The display device may include a plurality of gate lines disposed in a first direction; a plurality of data lines which is disposed in a second direction different from the first direction to define a plurality of sub pixels together with the plurality of gate lines; a sensing storage line disposed in the first direction; a sensing data line disposed in the second direction; pixel thin film transistors, each pixel thin film transistor including a first gate electrode connected to a respective one of the plurality of gate lines, a first source electrode connected to a respective one of the plurality of data lines, and a first drain electrode spaced apart from the first source electrode; and sensor thin film transistors, each sensor thin film transistor including a second gate electrode connected to the sensing storage line, a second source electrode electrically connected to the sensing data line, and a second drain electrode spaced apart from the second source electrode, the second drain electrode electrically connected to the first drain electrode to share a pixel storage capacitor.

The display device may further include a plurality of common lines disposed in the first direction.

The display device may further include a storage electrode configured by extending the first drain electrode.

The storage electrode may overlap the common line above the common line to configure the pixel storage capacitor.

The display device may further include an insulating layer above the first gate electrode and the second gate electrode; and at least another insulating layer above the first and second source electrodes and the first and second drain electrodes.

The display device may further include a first contact hole configured by removing a part of the at least another insulating layer to expose the storage electrode; and a second contact hole configured by removing another part of the at least another insulating layer to expose the second drain electrode.

The display device may further include a pixel electrode line which is electrically connected to the storage electrode through the first contact hole and is electrically connected to the second drain electrode through the second contact hole.

The display device may further include a plurality of common electrodes and pixel electrodes disposed on the at least another insulating layer.

One ends of the plurality of pixel electrodes may be connected to the pixel electrode lines.

One of the sensor thin film transistors may be disposed in one of the sub pixels.

One of the sensor thin film transistors may be disposed in two of the sub pixels.

Each sensor thin film transistor may generate an off current in response to an incident predetermined light source and the generated off current may be stored in the pixel storage capacitor.

The off current stored in the pixel storage capacitor may display a predetermined image in the corresponding sub pixel as a voltage may be applied to the sensing data line.

The sub pixels may be divided into a plurality of groups, each group comprises two columns of the sub pixels adjacent with each other, and the sub pixels in each group electrically connected the same data line.

The display device may further include a pixel capacitor which is disposed in parallel with the pixel thin film transistor and is connected to the pixel thin film transistors.

According to another aspect of the present disclosure, there is provided a display device. The display device may include a plurality of gate lines and a plurality of data lines which overlie each other to define a plurality of sub pixels; pixel thin film transistors each disposed in one of the sub pixels; pixel storage capacitors each disposed in one of the sub pixels; and sensor thin film transistors which share the pixel storage capacitors with the pixel thin film transistors and implement a predetermined image in the corresponding sub pixels in response to an incident predetermined light source.

The display device may further include a sensing storage line disposed to be parallel to the plurality of gate lines; and a sensing data line disposed to be parallel to the plurality of data lines.

A first gate electrode of each of the sensor thin film transistors may be electrically connected to the sensing storage line and a first source electrode of each of the sensor thin film transistors may be electrically connected to the sensing data line.

One of the sensor thin film transistors may be disposed in one of the sub pixels.

One of the sensor thin film transistors may be disposed in two of the sub pixels.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:
 a plurality of gate lines disposed in a first direction;
 a plurality of data lines which is disposed in a second direction different from the first direction to define a plurality of sub pixels together with the plurality of gate lines;
 a sensing storage line disposed in the first direction;
 a sensing data line disposed in the second direction;
 pixel thin film transistors, each pixel thin film transistor including a first gate electrode connected to a respective one of the plurality of gate lines, a first source electrode connected to a respective one of the plurality of data lines, and a first drain electrode spaced apart from the first source electrode; and
 sensor thin film transistors, each sensor thin film transistor including a second gate electrode connected to the sensing storage line, a second source electrode electrically connected to the sensing data line, and a second drain electrode spaced apart from the second source electrode, the second drain electrode electrically connected to the first drain electrode to share a pixel storage capacitor;
 a plurality of common lines disposed in the first direction;
 a storage electrode configured by extending the first drain electrode;
 an insulating layer above the first gate electrode and the second gate electrode;
 at least another insulating layer above the first and second source electrodes and the first and second drain electrodes;
 a first contact hole configured by removing a part of the at least another insulating layer to expose the storage electrode; and
 a second contact hole configured by removing another part of the at least another insulating layer to expose the second drain electrode.

2. The display device according to claim 1, wherein the storage electrode overlaps with a first the common line of the plurality of common lines above the first common line to configure the pixel storage capacitor.

3. The display device according to claim 1, further comprising:
 a pixel electrode line which is electrically connected to the storage electrode through the first contact hole and is electrically connected to the second drain electrode through the second contact hole.

4. The display device according to claim 3, further comprising:
 a plurality of common electrodes and pixel electrodes disposed on the at least another insulating layer.

5. The display device according to claim 4, wherein one end of the plurality of pixel electrodes is connected to the pixel electrode line.

6. The display device according to claim 1, wherein one of the sensor thin film transistors is disposed in one of the sub pixels.

7. The display device according to claim 1, wherein one of the sensor thin film transistors is disposed in two of the sub pixels.

8. The display device according to claim 1, wherein each sensor thin film transistor generates an off current in response to an incident predetermined light source and the generated off current is stored in the pixel storage capacitor.

9. The display device according to claim 8, wherein the off current stored in the pixel storage capacitor displays a predetermined image in a corresponding sub pixel of the plurality of sub pixels as a voltage is applied to the sensing data line.

10. The display device according to claim 1, wherein the sub pixels are divided into a plurality of groups, each group comprises two columns of the sub pixels adjacent with each other, and the sub pixels in each group electrically connected the same data line.

11. The display device according to claim 1, further comprises a pixel capacitor which is disposed in parallel with the pixel thin film transistor and is connected to the pixel thin film transistors.

12. A display device, comprising:
 a plurality of gate lines disposed in a first direction and a plurality of data lines which is disposed in a second direction different from the first direction, wherein the plurality of gate lines and the plurality of data lines overlie each other to define a plurality of sub pixels;
 a sensing storage line disposed between a first gate line of the plurality of the gate lines and a second gate line of the plurality of gate lines;
 a sensing data line disposed between a first data line of plurality of the data lines and a second data line of the plurality of the data lines;
 pixel thin film transistors each disposed in one of the sub pixels;
 pixel storage capacitors each disposed in one of the sub pixels; and
 sensor thin film transistors which share the pixel storage capacitors with the pixel thin film transistors and implement a predetermined image in the corresponding sub pixels of the plurality of sub pixels in response to an incident predetermined light source;

a plurality of common lines disposed in the first direction;

a storage electrode configured by extending a first drain electrode of the pixel thin film transistor;

an insulating layer above a first gate electrode of the pixel thin film transistor and a second gate electrode of the sensor thin film transistor;

at least another insulating layer above a first source electrode of the pixel thin film transistor, the first drain electrodes of the pixel thin film transistor, a second source electrode of the sensor thin film transistor, and a second drain electrode of the sensor thin film transistor;

a first contact hole configured by removing a part of the at least another insulating layer to expose the storage electrode; and a second contact hole configured by removing another part of the at least another insulating layer to expose the second drain electrode.

13. The display device according to claim 12, wherein the second gate electrode of each of the sensor thin film transistors is electrically connected to the sensing storage line and the second first source electrode of each of the sensor thin film transistors is electrically connected to the sensing data line.

14. The display device according to claim 12, wherein one of the sensor thin film transistors is disposed in one of the sub pixels.

15. The display device according to claim 12, wherein one of the sensor thin film transistors is disposed in two of the sub pixels.

* * * * *

UNITED STATES PATENT AND TRADEMARK OFFICE
CERTIFICATE OF CORRECTION

PATENT NO. : 10,971,096 B2
APPLICATION NO. : 16/522266
DATED : April 6, 2021
INVENTOR(S) : Daeyoung Seo et al.

Page 1 of 1

It is certified that error appears in the above-identified patent and that said Letters Patent is hereby corrected as shown below:

In the Claims

Column 22, Claim 2, Line 8:
"with a first the common line" should read: --with a first common line--.

Column 23, Claim 13, Line 24:
"the second first source electrode of each" should be: --the second source electrode of each--.

Signed and Sealed this
Twenty-sixth Day of October, 2021

Drew Hirshfeld
*Performing the Functions and Duties of the*
*Under Secretary of Commerce for Intellectual Property and*
*Director of the United States Patent and Trademark Office*